United States Patent [19]
Beyer

[11] Patent Number: 6,109,445
[45] Date of Patent: Aug. 29, 2000

[54] MODULAR TRAY SYSTEM

[75] Inventor: Anthony W. Beyer, Elburn, Ill.

[73] Assignee: Tek Pak, Inc., Batavia, Ill.

[21] Appl. No.: 09/170,440

[22] Filed: Oct. 13, 1998

Related U.S. Application Data

[60] Provisional application No. 60/090,536, Jun. 24, 1998.

[51] Int. Cl.$^7$ .................................................. B65D 85/30
[52] U.S. Cl. .......................... 206/714; 206/722; 206/561; 206/717
[58] Field of Search ...................... 206/561, 562, 206/564, 701, 722, 725, 507, 714, 717; 220/533, 549

[56] References Cited

U.S. PATENT DOCUMENTS

| | | | |
|---|---|---|---|
| 4,308,953 | 1/1982 | Cohen | 220/553 |
| 4,499,997 | 2/1985 | Swingley, Jr. . | |
| 4,527,222 | 7/1985 | Swingley, Jr. . | |
| 4,541,992 | 9/1985 | Jerge et al. . | |
| 4,619,363 | 10/1986 | Wolfseder . | |
| 4,763,782 | 8/1988 | Sinchok | 206/561 |
| 4,798,305 | 1/1989 | Laverty . | |
| 4,959,199 | 9/1990 | Brewer . | |
| 5,173,273 | 12/1992 | Brewer . | |
| 5,203,452 | 4/1993 | Small et al. . | |
| 5,215,205 | 6/1993 | Behlman | 220/533 |
| 5,226,226 | 7/1993 | Fierkens . | |
| 5,259,500 | 11/1993 | Alvite et al. . | |
| 5,265,723 | 11/1993 | Chenoweth et al. . | |
| 5,310,076 | 5/1994 | Burton et al. | 206/725 |
| 5,333,733 | 8/1994 | Murata . | |
| 5,370,225 | 12/1994 | Corey et al. | 206/328 |
| 5,394,988 | 3/1995 | Edwards et al. | 206/562 |
| 5,427,446 | 6/1995 | Glomski | 220/533 |
| 5,433,929 | 7/1995 | Riihimaki . | |
| 5,482,067 | 1/1996 | Wittrock et al. . | |
| 5,547,082 | 8/1996 | Royer et al. | 206/564 |
| 5,697,500 | 12/1997 | Walker | 206/207 |
| 5,731,230 | 3/1998 | Nevill et al. | 438/15 |
| 5,794,784 | 8/1998 | Murphy | 206/725 |

*Primary Examiner*—David T. Fidei
*Attorney, Agent, or Firm*—Rockey, Milnamow & Katz, Ltd.

[57] ABSTRACT

A modular tray system for holding component carriers includes a rectangular frame having retaining elements in the form of slots or pegs along opposite sides. Rails or partitions are arranged in parallel and selectively spaced apart along the opposite sides, and spaced apart along the opposite sides, and spanning between the opposite sides. Component carriers such as strips of thermoformed component-holding carrier tape are supported on the spaced apart rails. The modules can be stacked to allow for the holding of component carriers having relatively deep component-holding pockets.

64 Claims, 4 Drawing Sheets

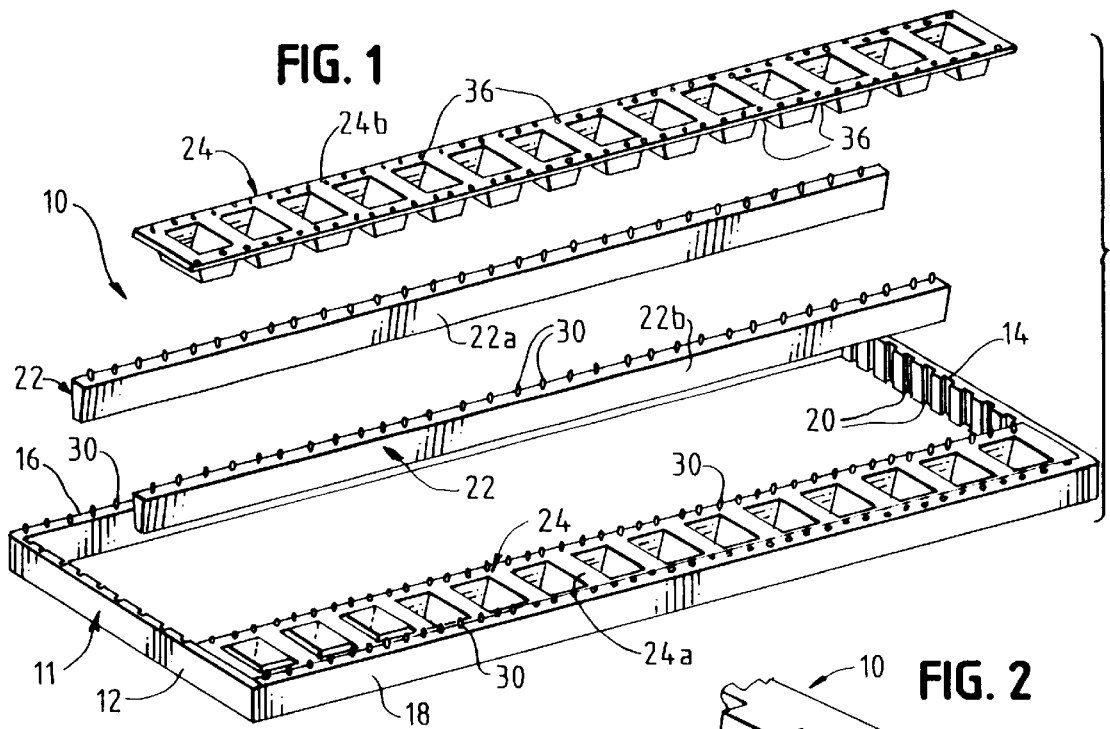
FIG. 1
FIG. 2
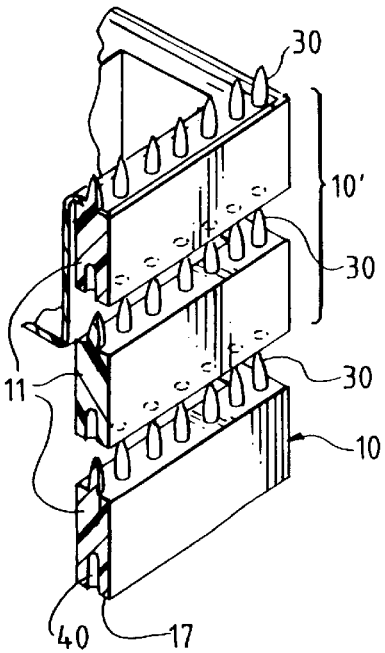
FIG. 3
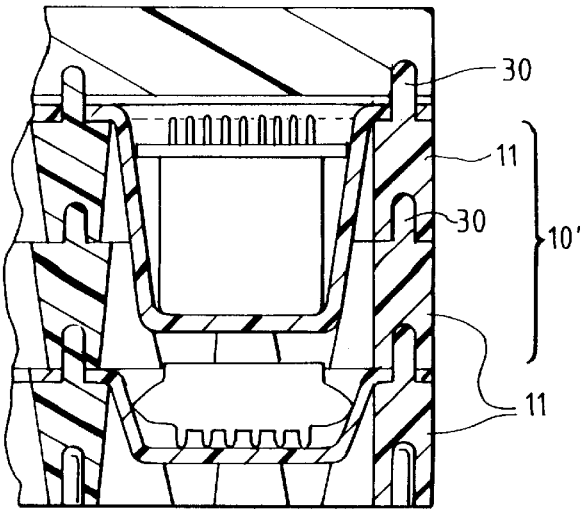
FIG. 4

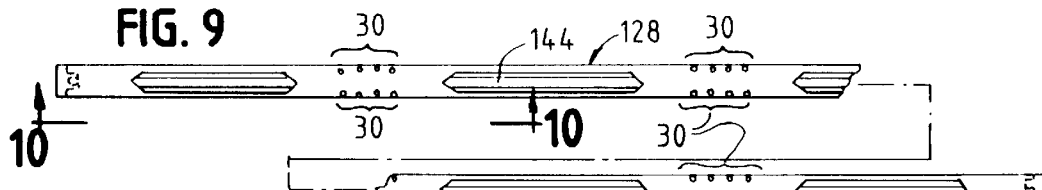
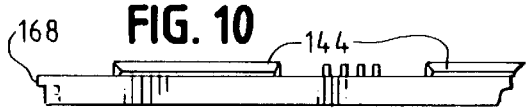
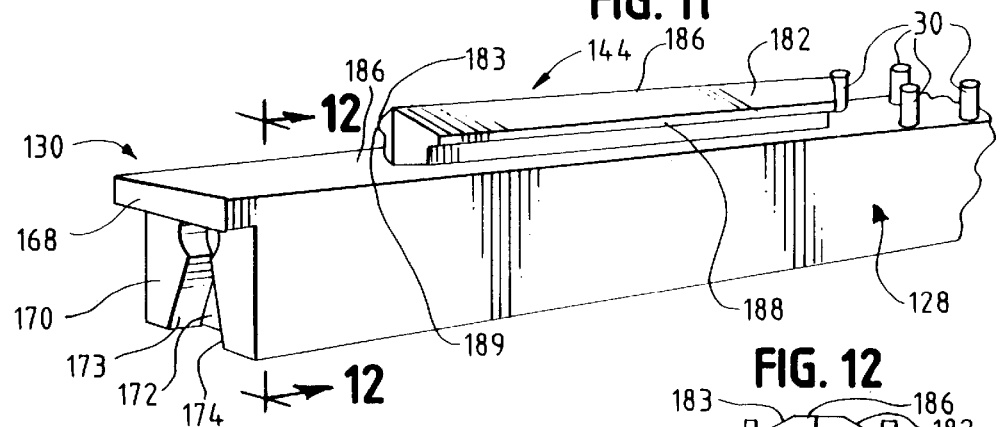
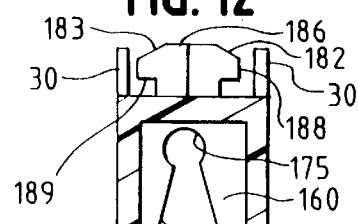
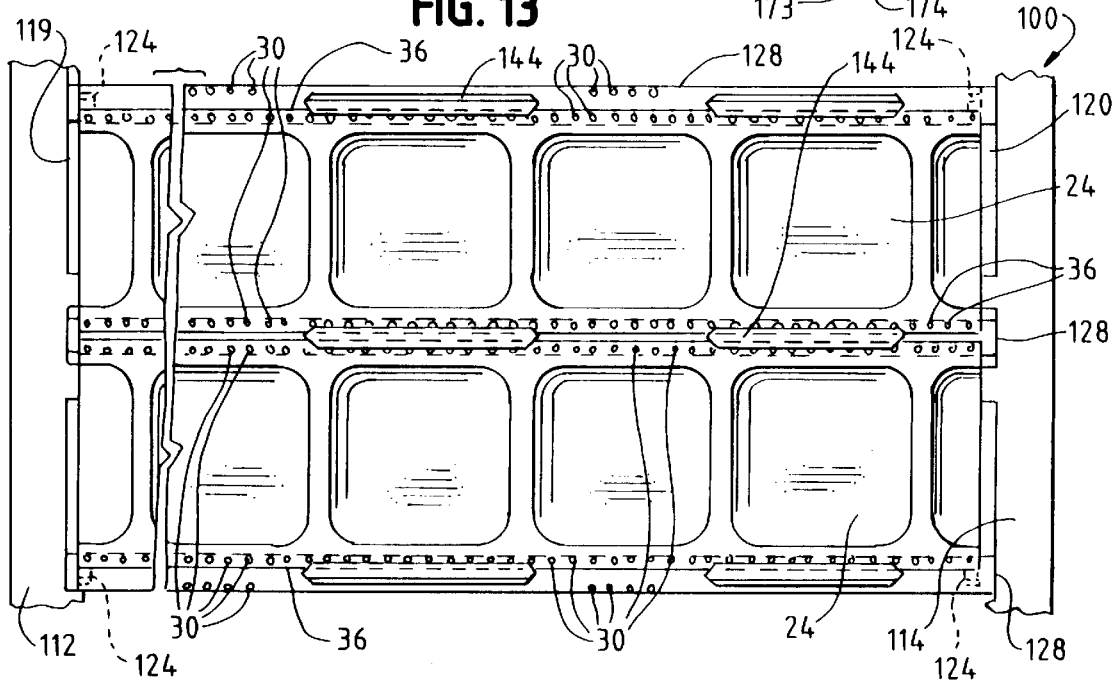

MODULAR TRAY SYSTEM

The present application claims the benefit of prior provisional application Serial No. 60/090,536, filed Jun. 24, 1998.

TECHNICAL FIELD OF THE INVENTION

The present invention relates to the transport of components for subsequent assembly. Particularly, the invention relates to the transport and storage of components held on stackable trays, the components to be installed onto printed circuit boards or other assemblies.

BACKGROUND OF THE INVENTION

In the assembly of electronic devices, surface mount components such as semiconductor chips or integrated circuits, contact elements and discrete electrical elements such as capacitors and resistors are installed onto printed circuit boards. The components must be delivered to an assembly staging area in some fashion to facilitate efficient mass production.

The use of embossed plastic carrier tapes for carrying components such as semiconductor chips or integrated circuits, contact elements or discrete electrical elements such as capacitors and resistors is well-recognized. The carrier tapes facilitate automatic handling, insertion and connection of components to printed circuit boards or other substrates. Embossed carrier tapes are fabricated to meet standardized requirements with respect to, for example, leader characteristics, pitch, trailer characteristics and cover tape.

Embossed carrier tapes have varying standard widths. Embossed carrier tapes are specified, for example, in the March, 1991, EIA-481-2 standard, entitled "16 mm and 24 mm Embossed Carrier Taping of Surface Mount Components for Automatic Handling". Other tapes are specified in the EIA-481-3 standard, of November 1991, entitled "32 mm, 44 mm and 56 mm Embossed Carrier Taping of Surface Mount Components for Automatic Handling". The EIA-481-1-A standard, dated August 1994, entitled "8 mm and 12 mm Punched & Embossed Carrier Taping of Surface Mount Components for Automatic Handling" specifies yet other tape sizes.

U.S. Pat. No. 5,259,500 describes a component feeder assembly for electronic components including reel drive means for advancing a roll of carrier tape which holds the electronic components. While some assembly apparatus are loaded with a roll of component-holding carrier tape and have mechanism for removing components from the roll, other assembly apparatus are loaded with component holding rectangular trays. The rectangular trays can be stacked onto a magazine station which presents trays in sequence to the component unloading apparatus. U.S. Pat. No. 5,226,226 describes a multiple compartment magazine for holding individual devices in matrices of rows and columns.

The present inventors have recognized the need for a versatile tray system for storage, transport and assembly staging within a factory and for shipping quantities of components to destinations outside the factory. The present inventors have recognized a need for a tray system which can accommodate strips of component-carrying tape, particularly strips of component-carrying tape of varying widths and depths. The present inventors have recognized the need for a stackable tray system for shipping strips of component-carrying tape or component holding trays, which is easily adapted to reliably ship a variable quantity of components.

SUMMARY OF THE INVENTION

The present invention contemplates a modular tray system for carrying component carriers wherein the tray system is adjustable for holding component carriers of varying widths and depths. The tray system includes plural tray modules each of which is able to carry a plurality of component carriers, having varying widths and depths. The component carriers can include component trays such as carrier tapes, supported on rails. The component trays include plural pockets along their length for holding components.

The tray modules can be loaded into a magazine-type loader. From the loader, components can be removed from component carriers on the tray modules and installed onto a substrate, such as a printed circuit board. The stacked tray modules are able to conveniently and safely ship component carriers holding semiconductor chips or other types of components, within or outside of a factory.

The preferred embodiment of the tray module of the present invention includes a rectangular frame member having opposing front and rear end walls connected together by parallel, spaced-apart sidewalls, forming a rectangular shape. The opposing front and rear end walls include a plurality of retaining elements or engagement portions such as slots or pegs.

A plurality of rails or partitions engage the front and rear end walls by engaging opposing engagement portions of the front and rear end walls. The engagement portions are arranged to allow for an adjustment of the lateral distance between adjacent rails to accommodate varying widths of the component trays. The rails can include double sided tape applied on a top surface thereof for securing the component trays thereon.

Although slots and pegs are described as engagement portions on the end walls, and end regions and key holes are described as engagement portions on the rails, other mechanisms for releasably fastening component carriers, rails or portions to the end walls are encompassed by the invention.

The tray system of the present invention can include a plurality of such tray modules each with respective bottom and top surfaces thereof configured for nesting together and/or latching together so that the trays can be efficiently and effectively stacked. Accordingly, each module can include retainers extending from a top surface and shaped slots formed in a bottom surface. The retainers can latch into the shaped slots. Additionally, by stacking a further tray module onto the first tray module, the tray module will be captured thereon and protected by the overlying tray module. The uppermost tray module and/or the lowermost tray can be covered by a protective cover plate.

In an alternate embodiment of the invention, the component carrier can be molded as rigid, injection molded component-carrying tray parts having integral rails which are spaced apart and adapted to engage the engagement portion of the front and rear end walls of the frame member. The top surface of the component-carrying tray parts can be covered with a film to protect the components carried thereby.

Additionally, multiple tray modules can be stacked, and respective rails or component carrying tray parts, can be arranged to vary the overall depth of the modules, for accommodating component trays, or component carrying tray parts, having greater depths than would be accommodated by a single tray module.

Numerous other advantages and features of the present invention will become readily apparent from the following detailed description of the intention and the embodiments thereof, from the claims and from the accompanying drawings in which details of the invention are fully and completely disclosed as part of this specification.

BRIEF DESCRIPTION OF THE DRAWINGS

FIG. 1 is an exploded perspective view of a single tray module of a tray system of the present invention;

FIG. 2 is an enlarged fragmentary perspective view of the tray module of FIG. 1;

FIG. 3 is an enlarged fragmentary perspective view of a plurality of tray modules in a stacked configuration;

FIG. 4 is a sectional view of the tray system shown in FIG. 3 with a cover plate;

FIG. 9 is a top plan view of a rail shown in FIG. 5;

FIG. 10 is a partial elevational view of the rail of FIG. 9 viewed along line 10—10;

FIG. 11 is an enlarged fragmentary perspective view of the rail shown in FIG. 9;

FIG. 12 is a sectional view of the rail taken generally along line 12—12 of FIG. 11;

FIG. 13 is a plan view of the module of FIG. 5; and

DETAILED DESCRIPTION OF THE PREFERRED EMBODIMENTS

Figure 5:
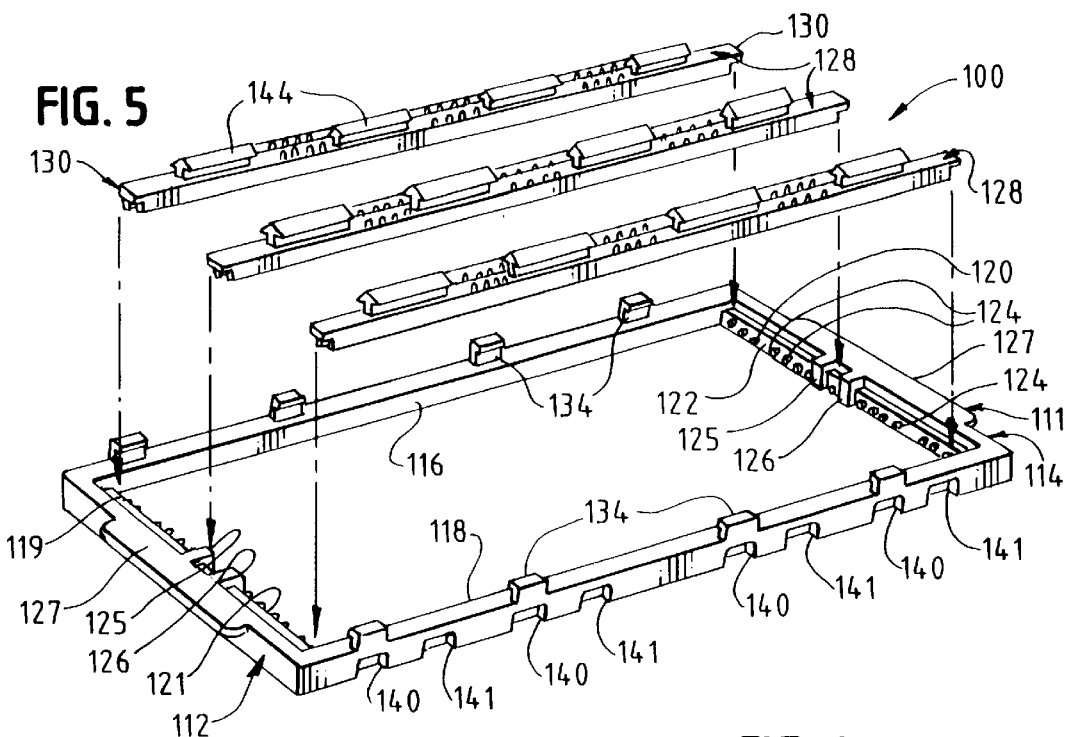
FIG. 5 is an exploded perspective view of an alternate embodiment tray module.

While this invention is susceptible of embodiment in many different forms, there are shown in the drawings and will be described herein in detail, specific embodiments thereof with the understanding that the present disclosure is to be considered as an exemplification of the principles of the invention and is not intended to limit the invention to the specific embodiments illustrated.

FIG. 1 illustrates a tray module 10 having a frame 11 formed in a rectangular shape having front and rear walls 12, 14 and side walls 16, 18. The end walls 12, 14 include a plurality of engagement portions, such as slots 20. Rails 22 can be snapped into the slots 20. The slots are spaced apart from one another a preselected distance such that selectable slots corresponds to the width of a component carrier, such as a component tray in the form of a carrier tape 24. The carrier tape 24 is supported, at least in part, by one or more of the plurality of rails 22.

The carrier tape 24 can have a length which corresponds to a portion of, or all of the length of the frame 11. The carrier tape 24 can be cut off from a reel of thermoformed carrier tape. Alternately, molded, rigid component carrying strips can be used.

A given tray module 10 can carry various widths and/or configurations of carrier tapes 24. It should be understood that the tray module 10 could carry several identical carrier tapes, such as identical carrier tapes 24. Alternately, the tray module 10 could carry several different carrier tapes having different widths, different depths and/or different shapes of component-holding pockets. One of the carrier tapes 24a is illustrated in FIG. 1 as being supported by one rail 22 and the side wall 18 of the frame 11. The respective other carrier tape 24b is supported by two rails 22a, 22b.

As illustrated in FIGS. 1 and 2 the tray modules 10 can include positioning pins 30, making them more effective for direct use in manufacturing. The pins 30 are located spaced apart longitudinally on top surfaces of the rails 22 and the side walls 16, 18. A sufficient number of pins are required to set and hold the position of the component trays, such as carrier tapes 24, onto the module. The pins 30 are spaced apart to register with machine holes 36 already present on component carrier tapes. The components loaded in the carrier tapes 24a, 24b could be more precisely extracted automatically by the assembling machinery, such as a pick-and-place robot, as a result of positioning the tray module and carrier tapes in precise position on the machinery.

Additionally, as illustrated in FIGS. 2 and 4, the rails 22 and the side walls 16, 18 include pin-receiving sockets 40 which are spaced apart to register with the pins 30 of an underlying module. The sockets 40 are provided to eliminate interference between the pins 30 and a bottom surface 23 of the rails, or a bottom surface 17, of the side walls 16, 18 during stacking. Thus, the frames 11 of adjacent modules can be stacked in a flush relationship as shown in FIG. 4. The sockets 40 can have a loose fit over the pins 30 to serve the noninterference function or can have a snug fit to serve an additional function of releasably fastening adjacent frames 11 together.

As illustrated in FIGS. 3 and 4, the tray module 10 is intended to be a component of a stackable tray system. A given tray module 10 can be loaded with a combination of rails and strips of carrier tape preloaded with components. Another tray module 10 can be stacked thereon with a different combination of rails and strips of preloaded carrier tapes. Alternatively, one or more frames 11 can be stacked to form a deeper single tray module 10' having a plurality of rails 22 which are located in corresponding slots 20. The rails 20 can be installed only on the upper frame 11, or on each frame 11 which makes up the stack forming the deeper tray module 10'. In this case, thermoformed carrier tapes having deeper pockets can be supported by the spaced apart rails and can extend into the depth provided by multiple stacked frames 11. Advantageously, each tray module frame 11 has a nominal depth of 0.25 inches.

Instead of flexible thermoformed carrier tapes, such as the carrier tapes 24b supported on rails 22a, 22b, shown in FIG. 1, the component carrier can be formed as an elongated, rigid, injection molded component-carrying element or tray part which also has integral rails, which can be snap fit into the slots 20. These elements can be provided in varying widths. The widths correspond to the spaced apart slots 20.

Widths for the component carrier tapes 24a, 24b range from 8 to 56 mm. It should be understood that when loaded, the carrier tapes can be covered with an adhesively attached, sealable cover layer to protect the preloaded components and to retain the components in the strip of carrier tape until time to extract them during assembly. Alternatively, or additionally, the carrier tapes held on the tray module 10 can be covered by a common cover layer. The cover layers are not shown for clarity.

FIG. 5 illustrates an alternate embodiment module 100 which includes a rectangular frame 111 formed by a front wall 112, a rear wall 114, and two side walls 116, 118, forming a rectangle. The front wall 112 and the rear wall 114 each include a recessed ledge surface 119, 120 respectively, each contiguous with an inside surface 121, 122 respectively. Extending perpendicularly from the inside surfaces 121, 122 are a plurality of engagement portions, such as rail pegs 124. Also, extending above each respective ledge surface 119, 120 and inwardly of the inside surfaces 121, 122 are machine positioning tabs 125, 126 which have surfaces for accurate positioning of the tray module 100 (or group of stacked modules) onto a staging area for an automated pick-and-place assembly robot, or any other staging area which requires precise location of the module 100. Handling tabs 127 extend outwardly of each end wall 112, 114.

Rails 128 are arranged to fit between the front wall 112 and the rear wall 114. Each rail includes an engagement part 130 at each end thereof which engages an engagement portion such as one rail peg 124 on each of the front wall 112 and the rear wall 114. The rails span substantially the length of the frame 111. The rails 128 can be adjusted in position along the length of the front wall 112 and the rear wall 114 by engaging different pairs of opposing pegs 124 on the front and rear walls 112, 114 respectively.

The frame also includes a plurality of hook-shaped retainers 134 arranged spaced apart along the side walls 116, 118. Beneath each retainer 134 is a retainer engagement slot 140 which receives a hook-shaped retainer 134 of an identical, underlying module 100 to releasably fasten, or latch, two modules 100 in stacked fashion.

A nesting slot 141 is located adjacent to each engagement slot 140. The nesting slots 141 are plain and each sized to loosely receive one hook-shaped retainer 134.

The rails 128 also include bidirectional hook rails 144 spaced apart along a length of the rails 128. The bidirectional hook rails 144 can function to retain two adjacent component trays, such as two carrier tapes 24, onto the tray module. Two rows of positioning pins 30 are located lengthwise between the bidirectional hook rails 144, and function to locate the component trays, such as carrier tapes 24, precisely onto the module.

Figure 6:
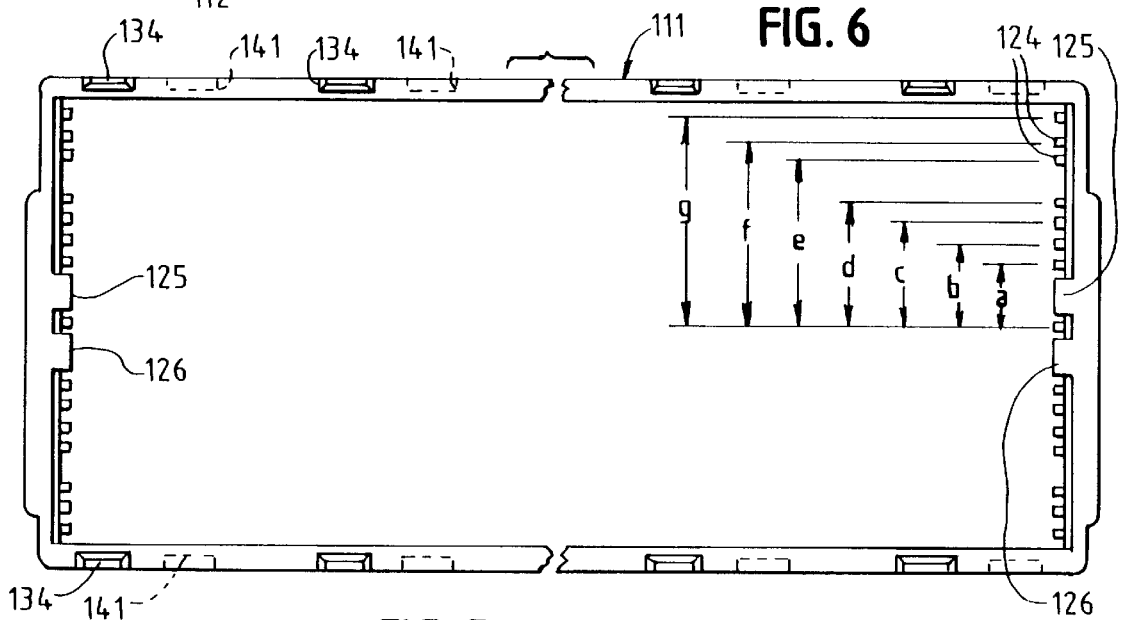
FIG. 6 is a top plan view of the tray module of FIG. 5, with rails removed for clarity.

FIG. 6 illustrates the variable widths achievable with the illustrated positioning of the rail pegs 124. According to the preferred embodiment, the indicated spacing of the pegs is as follows:

a = 17 mm
b = 23 mm
c = 29 mm
d = 34 mm
e = 46 mm
f = 51 mm
g = 85 mm

This spacing will advantageously accommodate rail placement to hold, for example, three 32 mm tapes side-by-side; two 44 mm tapes side-by-side; or two 56 mm tapes side-by-side.

Figure 8:
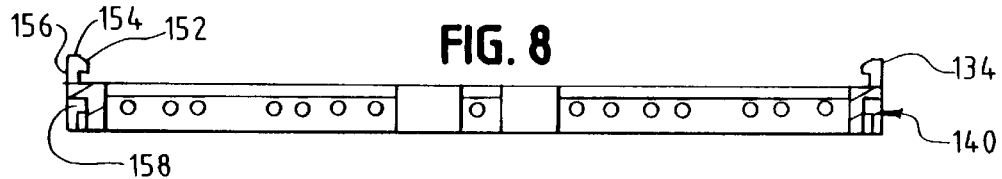
FIG. 8 is an enlarged sectional view taken generally along line 8×8 of FIG. 7.

FIG. 8 illustrates the shape of the hook-shaped retainers 134. The retainers 134 include a beveled guide surface 152 formed on a horizontal leg 154. The horizontal leg 154 extends inwardly from a vertical leg 156. Beneath the retainer 134 are located the retainer engagement slots 140. The slots 140 have a substantially hook shaped opening which latches with the retainers 134 when received therein.

The guide surface 152 causes the retainers to flex outwardly from contact force from the bottom surface of an overlying module 100 as the modules are pressed together until the horizontal leg 154 is received into a horizontal portion 158 of the slot 140. The modules can thus be stacked and snap-fastened or latched together.

FIGS. 9 through 12 illustrate the rail 128 in more detail. The rail 128 is substantially U-shaped (inverted) in cross section, providing an open area 160 for the receipt of a bidirectional hook rail 144 therein when two modules 100 are stacked, see FIG. 12. The engagement portion 130 includes an overhanging lip 168 to be supported on one of the ledges 119, 120. Contiguous to the lip is an end wall 170 having a keyhole-shaped slot 172 formed therethrough.

The slot includes angles entry walls 173, 174 which form a V-shape notch open into a circular opening 175. The opening 175 is sized to receive a rail peg 124 which has been resiliently forced through the V-shape notch of the walls 173, 174.

The bidirectional hook rail 144 includes pitched surfaces 182, 183 sloping downwardly on opposite sides of a top surface 186 of the rail. These surfaces 182, 183 assist in centering a component tray onto the module 100 between adjacent rails 128. The component tray, such as a carrier tape 24, can then be pressed downwardly to snap beneath one of two opposite overhang portions 188, 189. The hook rail 144 can hold two longitudinal edges of adjacent component trays to the rail 128.

FIG. 13 illustrates two component trays, such as carrier tapes 24 installed side-by-side onto a module 100. Three rails 128 are pressed onto the ledges 119, 120 and engage pegs 124 to be locked to the front wall 112 and the rear wall 114. The machine indexing holes 36 of the two tapes 24 register with one row positioning pins 30 of the outside rails 128 respectively, and register to one of each two rows of positioning pins on the center rail 128. The tapes fit beneath the overhang lips 188, 189 of adjacent pairs of the rails 128, respectively.

The module 100 are intended to be stacked with like modules 100, substantially as described with regard to FIGS. 1 through 4. Module frames 111 can be stacked to create deeper modules for holding component trays having relatively deep component-holding pockets. The rails 128 can be arranged to hold component trays of a same width on the module, or can be arranged to hold component trays of different widths on the same module. The entire module 100, filled with a preselected number of component trays, can be covered by a film to retain components within their component trays. Alternatively, or additionally, the component trays, such as strips of carrier tape 24, can be preloaded and presealed with film to retain the components on the tapes.

Figure 14:
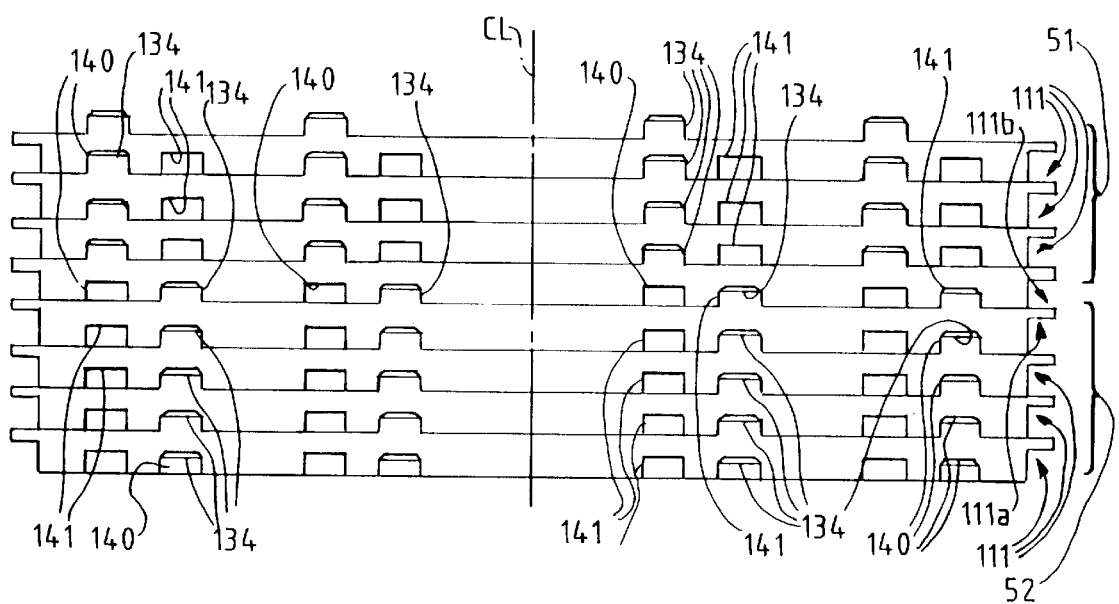
FIG. 14 is an elevational view of a plurality of the alternate embodiment modules arranged in a stack.

FIG. 14 illustrates a further advantage of the configuration of the alternate module 100. Shown are two stacks S1, S2 of module frames 111. Within each stack S1, S2 the frames 111 are latched together by the engagement of the hook-shaped retainers 134 into the engagement slots 140. However, due to the arrangement of the engagement slots 140 and the nesting slots 141 the two stacks S1, S2 are relatively oriented to be nested together, but not latched together.

Figure 7:
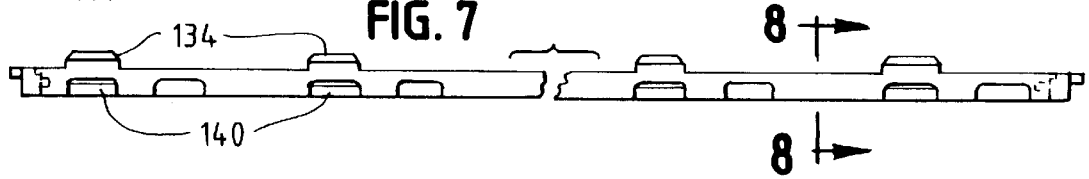
FIG. 7 is an elevational view of the tray module shown in FIG. 6.

As illustrated in FIGS. 6 and 7 each frame 111 has engagement slots 140 consistently on a same side of adjacent nesting slots 141, to the left of each nesting slot 141 as shown in FIGS. 6 and 7. The retainer 134, the engagement slots 140 and the nesting slots are so arranged that if a module frame 111a is rotated 180° about a vertical centerline CL as shown in FIG. 14, with respect to a module frame 111b, the hook-shaped retainers 134 will register with the nesting slots 141 of the overlying frame 111b, rather than registering with the engagement slots 140. Thus, as shown in FIG. 14, the top stack S1 is rotated 180° with respect to the bottom stack S2 and the hook-shaped retainer 134 of the frame 111a are not latched into the engagement slots 140 of the frame 111b. The two stacks S1, S2 are nested loosely by the hook-shaped retainers 134 of the frame 111a being received by the nesting slots 141 of the frame 111b.

The present inventive tray modules 10, 100 are useful in the assembly process, and for shipping. For some assembling processes, components are fed to pick-and-place machinery via stacked trays. When a stacked tray is emptied it is lifted away by the pick-and-place machinery to expose the new tray. Additionally, the tray modules can be used as shipping packages within a factory or to destinations outside the factory. The tray module can thus be a standard modular unit which is modified to accept component trays such as carrier tapes of varying widths. A PSA heat activated cover tape can be applied over each component tray or all of the component trays to contain the products on the tray module.

Numerous modifications may be made to the foregoing system without departing from the basic teachings thereof. Although the present invention has been described in substantial detail with reference to one or more specific embodiments, those of skill in the art will recognize that changes may be made thereto without departing from the scope and spirit of the invention as set forth in the appended claims.

The invention claimed is:

1. A tray system for holding a plurality of components, comprising:
a first rectangular stackable frame having a front wall, a rear wall, and opposing spaced-apart side walls, said side walls connecting said front wall to said rear wall in a rectangular configuration, said front wall and said rear wall having a plurality of spaced-apart engagement portions;
at least one separate component carrier, for supporting a plurality of components arranged in a longitudinal row, and including a front portion for releasible engagement to at least one of said engagement portions of said front wall, and a rear portion for releasible engagement to at least one of said engagement portions of said rear wall, to mount said component carrier to said frame wherein the carrier rests in part on top of one of the side walls.

2. The tray system according to claim 1, wherein said component carrier includes parallel rails, said front and rear portions formed at front and rear ends of said parallel rails, and a component tray having pockets for holding said components and arranged to be supported along longitudinal edges by said parallel rails.

3. The tray system according to claim 2, wherein said component tray and said rails are formed as a unitary structure.

4. The tray system according to claim 2, further comprising a cover film applied over said component tray.

5. The tray system according to claim 1, wherein said component carrier comprises a component holding tape strip and at least two parallel rails, wherein said rails include elements for locating said tape strip on said rails, wherein said tape strip is supported on said rails, and said front and rear portions are end portions of said rails.

6. A tray system for holding a plurality of components, comprising:
a first rectangular frame having a front wall, a rear wall, and opposing spaced-apart side walls, said side walls connecting said front wall to said rear wall in a rectangular configuration, said front wall and said rear wall having a plurality of spaced-apart engagement portions;
at least one component carrier, for supporting a plurality of components arranged in a longitudinal row, and including a front portion for engagement to at least one of said engagement portions of said front wall, and a rear portion for engagement to at least one of said engagement portions of said rear wall, to mount said component carrier to said frame,
wherein said component carrier comprises a component holding tape strip and at least two parallel rails, wherein said rails include elements for locating said tape strip on said rails, wherein said tape strip is supported on said rails, and said front and rear portions are end portions of said rails;
wherein said tape strip includes machine indexing holes, and said elements comprise pins which are spaced to register with and penetrate said machine indexing holes of said tape strip.

7. A tray system for holding a plurality of components, comprising:
a first rectangular frame having a front wall, a rear wall, and opposing spaced-apart side walls, said side walls connecting said front wall to said rear wall in a rectangular configuration, said front wall and said rear wall having a plurality of spaced-apart engagement portions;
at least one component carrier, for supporting a plurality of components arranged in a longitudinal row, and including a front portion for engagement to at least one of said engagement portions of said front wall, and a rear portion for engagement to at least one of said engagement portions of said rear wall, to mount said component carrier to said frame,
wherein said component carrier comprises a component holding tape strip and at least two parallel rails, wherein said rails include elements for locating said tape strip on said rails, wherein said tape strip is supported on said rails, and said front and rear portions are end portions of said rails;
wherein said engagement portions comprise slots and said end portions of said rails are each interfitted into one of said slots.

8. A tray system for holding a plurality of components, comprising:
a first rectangular frame having a front wall, a rear wall, and opposing spaced-apart side walls, said side walls connecting said front wall to said rear wall in a rectangular configuration, said front wall and said rear wall having a plurality of spaced-apart engagement portions;
at least one component carrier, for supporting a plurality of components arranged in a longitudinal row, and including a front portion for engagement to at least one of said engagement portions of said front wall, and a rear portion for engagement to at least one of said engagement portions of said rear wall, to mount said component carrier to said frame,
wherein said component carrier comprises a component holding tape strip and at least two parallel rails, wherein said rails include elements for locating said tape strip on said rails, wherein said tape strip is supported on said rails, and said front and rear portions are end portions of said rails;
wherein said engagement portions comprise pegs and each of said end portions of said rails includes a slot for capturing one of said pegs.

9. The tray system according to claim 1, further comprising a second rectangular frame sized to fit onto said first rectangular frame, said second rectangular frame having a plurality of component carriers arranged between front and rear end walls of said second rectangular frame.

10. The tray system according to claim 9, wherein said first and second rectangular frames have portions that latch together when stacked.

11. The tray system according to claim 10, wherein each of said first and second rectangular frames include plural component carriers supported by said frames.

12. The tray system according to claim 1, comprising at least two component carriers having component trays having pockets for holding said components and having different widths, and parallel rails for supporting said component trays along longitudinal edges thereof, said rails supporting said two component trays are spaced apart accordingly, said front and rear portions formed at front and rear ends of each of said parallel rails and engaged to corresponding engagement portions on said front and rear end walls.

13. A tray for holding a plurality of strips of component holding carrier tape comprising:
an open rectangular frame having two sets of opposing walls, the members of one set of said opposing walls having a plurality of engagement portions facing toward an interior region of said frame, and a plurality of separate rails extending between said one set of opposing walls and each having opposite end regions for engagement to two of said engagement portions, wherein each of said rails is arranged for supporting at least one longitudinal edge of a strip of component-holding carrier tape and wherein the members of another set of opposing walls have top surfaces for supporting at least one longitudinal edge of a respective strip of component holding carrier tape.

14. The tray according to claim 13, wherein said engagement portions are more numerous than said end regions, providing for alternate positions of said rails along said opposing walls.

15. The tray according to claim 13 wherein said opposing walls are connected by parallel side walls.

16. The tray according to claim 13 wherein said frame includes a raised portion on a first surface thereof and a compatible space on a second surface thereof shaped to receive and engage an identical raised portion of a like tray in nesting fashion to stack said tray and the like tray.

17. The tray according to claim 13 further comprising a cover sized to overly said frame.

18. The tray according to claim 13, wherein said rails include pins which are spaced to register with and penetrate machine indexing holes of said carrier tape.

19. The tray according to claim 13, wherein said engagement portions comprise slots and said end regions of said rails are each interfit into one of said slots.

20. The tray according to claim 13, wherein said engagement portions comprise pegs and each of said end regions of said rails includes a slot for capturing one of said pegs.

21. A tray system as in claim 1, wherein said component carrier is restrained against vertical and horizontal movement by said engagement portions.

22. A tray system as in claim 1 which includes a second carrier engageable with a second set of respective, spaced apart, engagement portions, one located on each end wall, and positionable to extend between the end walls.

23. A tray system as in claim 22 which includes a second rectangular frame, nestable with the rectangular frame and substantially identical thereto.

24. A tray system as in claim 23, wherein the second frame carries at least one carrier, removably engageable therewith, and said carrier includes a rail and a component holding carrier tape, and said rail and a respective one of the side walls adapted to support edges of said carrier tape.

25. A tray module for holding components, comprising:
opposing end walls;
a plurality of removable elongate members having a length to span between said opposing end walls, at least some of said elongate members having first engagement portions at opposite ends thereof;
a removable first plurality of component-holding compartments connected together in a line, and having lateral flanges which define a first width;
a removable second plurality of component-holding compartments connected together in a line and having lateral flanges which define a second width;
said opposing end walls having a plurality of second engagement portions spaced apart and located at selected positions along said opposing end walls;
said some of said elongate members removably positioned at plural selected positions along said opposing end walls including selected positions which define a distance between adjacent elongate members substantially equivalent to said first width and to said second width for removably supporting said flanges of said first and second pluralities of component holding compartments thereon.

26. A tray module for holding components, comprising:
opposing end walls;
a plurality of elongate members having a length to span between said opposing end walls, at least some of said elongate members having first engagement portions at opposite ends thereof;
a first plurality of component-holding compartments connected together in a line, and having lateral flanges which define a first width;
a second plurality of component-holding compartments connected together in a line and having lateral flanges which define a second width;
said opposing end walls having a plurality of second engagement portions spaced apart and located at selected positions along said opposing end walls;
said some of said elongate members positioned at plural selected positions along said opposing end walls including selected positions which define a distance between adjacent elongate members substantially equivalent to said first width and to said second width for supporting said flanges of said first and second pluralities of component holding compartments thereon; and
wherein two of said elongated members comprise sidewalls of said module and together with said end walls define a rectangular frame with an open central area, said side walls including hook shaped retainers extending perpendicularly from a top plane of said rectangular frame and said side walls including engagement slots formed from a bottom plane of said rectangular frame and below each hook-shaped retainer such that an identical module to said tray module can be stacked and latched to said tray module by engaging said hook-shaped retainers of said identical module to said engagement slots of said tray module.

27. The tray module according to claim 26 wherein said sidewalls include nesting slots, each nesting slot arranged adjacent to one engagement slot and when said identical module is rotated 180° about a centerline perpendicular to said top plane, said hook-shaped retainers register and nest loosely with said nesting slots.

28. A tray system as in claim 1, comprising:
   a plurality of substantially identical frames including said first frame, wherein each of the frames can be stacked on another frame forming a composite frame having a depth greater than a single frame and wherein each of the frames includes first and second spaced apart end walls with each of the end walls joined by spaced apart side walls to thereby define a carrier receiving region bounded by the side walls and the end walls, wherein each of the end walls carries engagment portions oriented toward the carrier receiving region, wherein each of said frames has a latch formation and a latch receiving formation arranged in vertical alignment, so that adjacent stacked frames can be latched together with the latch formation of one frame engaging the latch receiving formation of a respective adjacent frame; and
   a plurality of component carriers, wherein each component carrier is removably attachable to respective engagement portions, wherein said component carriers of said plurality of component carriers have varying widths within some of said frames.

29. A stackable tray system for transporting plastic component carriers comprising:
   a plurality of substantially identical frames wherein each of the frames can be stacked on another frame forming a composite frame having a depth greater than a single frame and wherein each of the frames includes first and second spaced apart ends with each of the ends joined by spaced apart sides to thereby define a carrier receiving region bounded by the sides and the ends, wherein each of the ends carries divider attachment elements oriented toward the carrier receiving region; and
   a plurality of dividers, wherein each divider is removably attachable to respective divider attachments, wherein at least some of the dividers are attached to some of the frames to form variable width component carrier slots in the respective region with a respective carrier supported along a first edge by a respective divider and along a second, spaced apart, edge by one of, another divider and a side of the respective frame;
   wherein the component carriers exhibit perforations along the edges thereof and wherein the dividers carry protrusions intended to slidably engage respective perforations of a component carrier to be supported by the respective tray.

30. A system as in claim 29 wherein the dividers define spaced-apart openings displaced from the protrusions whereby one divider can be stacked on a second wherein the protrusions of the second divider slidably engage the openings in the one divider.

31. A system as in claim 28 wherein the divider attachment elements comprise divider receiving slots.

32. A system as in claim 28 wherein first and second composite frames and respective dividers can be stacked one on the other with respective component carriers retained therebetween.

33. A stackable tray assemblage for supporting insertable/removable plastic component carriers having various widths, the assemblage comprising:
   a first frame having first and second spaced apart ends joined by first and second, spaced apart, sides wherein the ends and sides each have a substantially common, selected frame height and define a carrier receiving region bounded thereby, wherein each of the ends carries at least one divider attachment element oriented toward the carrier receiving region; and
   at least a first divider removably attachable to respective divider attachment elements, wherein the first divider forms at least two carrier slots, at least one of which has a width corresponding to a width of a respective component carrier to be inserted therein, with the respective carrier supported along a first edge by a top surface of a respective divider and along a second, spaced apart, edge by a top surface of a side of the first frame.

34. A stackable tray assemblage for supporting insertable/removable plastic component carriers having various widths, the assemblage comprising:
   a first frame having first and second spaced apart ends joined by first and second, spaced apart, sides wherein the ends and sides each have a substantially common, selected frame height and define a carrier receiving region bounded thereby, wherein each of the ends carries at least one divider attachment element oriented toward the carrier receiving region; and
   at least a first divider removably attachable to respective divider attachment elements, wherein the first divider forms at least two carrier slots, each having a width corresponding to a width of a respective component carrier to be inserted therein, with the respective carrier supported along a first edge by a respective divider and along a second, spaced apart, edge by one of another divider and a side of the first frame which includes a second, stackable frame, substantially identical to the first frame, wherein the first frame can be stacked on the second frame thereby forming one of a composite frame having a composite height twice that of the frame height whereby component carriers having a height greater than the frame height can be supported in a respective carrier slot, and, two independent, stacked frames whereby component carriers having a height less than or equal to the frame height can be received in respective carrier slots in each frame; wherein at least one of the frames includes an actuatable latch for coupling the two frames together when stacked as a composite frame, and, not otherwise when stacked and wherein the latch is activated by rotating one of the frames relative to the other.

35. An assemblage as in claim 34 which includes a second divider, removably attachable to respective divider attachment elements of the second frame whereby the first divider overlies the second divider when the frames are stacked.

36. An assemblage as in claim 34 which includes a plurality of substantially identical dividers attachable to a selected frame.

37. A stackable tray assemblage for supporting insertable/removable plastic component carriers having various widths, the assemblage comprising:
   a first frame having first and second spaced apart ends joined by first and second, spaced apart, sides wherein the ends and sides each have a substantially common, selected frame height and define a carrier receiving region bounded thereby, wherein each of the ends carries at least one divider attachment element oriented toward the carrier receiving region; and
   at least a first divider removably attachable to respective divider attachment elements, wherein the first divider forms at least two carrier slots, each having a width corresponding to a width of a respective component carrier to be inserted therein, with the respective carrier supported along a first edge by a respective divider and along a second, spaced apart, edge by one of another divider and a side of the first frame; and wherein the first divider includes a plurality of spaced apart protrusions whereby a component carrier having a plurality of spaced apart positioning openings slidably engages at least some of the protrusions when inserted into a respective carrier slot.

38. A stackable tray assemblage for supporting insertable/removable plastic component carriers having various widths, the assemblage comprising:

a first frame having first and second spaced apart ends joined by first and second, spaced apart, sides wherein the ends and sides each have a substantially common, selected frame height and define a carrier receiving region bounded thereby, wherein each of the ends carries at least one divider attachment element oriented toward the carrier receiving region; and at least a first divider removably attachable to respective divider attachment elements, wherein the first divider forms at least two carrier slots, each having a width corresponding to a width of a respective component carrier to be inserted therein, with the respective carrier supported along a first edge by a respective divider and along a second, spaced apart, edge by one of another divider and a side of the first frame; and wherein the first frame includes a plurality of spaced apart protrusions whereby a component carrier having a plurality of spaced apart positioning openings slidably engages at least some of the protrusions when inserted into a respective carrier slot.

39. A stackable tray assemblage for supporting insertable/removable plastic component carriers having various widths, the assemblage comprising:

a first frame having first and second spaced apart ends joined by first and second, spaced apart, sides wherein the ends and sides each have a substantially common, selected frame height and define a carrier receiving region bounded thereby, wherein each of the ends carries at least one divider attachment element oriented toward the carrier receiving region; and at least a first divider removably attachable to respective divider attachment elements, wherein the first divider forms at least two carrier slots, each having a width corresponding to a width of a respective component carrier to be inserted therein, with the respective carrier supported along a first edge by a respective divider and along a second, spaced apart, edge by one of another divider and a side of the first frame and which includes a second, stackable frame, substantially identical to the first frame, wherein the first frame can be stacked on the second frame thereby forming one of a composite frame having a composite height twice that of the frame height whereby component carriers having a height greater than the frame height can be supported in a respective carrier slot, and, two independent, stacked frames whereby component carriers having a height less than or equal to the frame height can be received in respective carrier slots in each frame; and wherein the first frame includes protrusion receiving openings defined in a surface thereof which abuts the second frame, as stacked, and wherein the second frame includes protrusions which mate with the receiving openings when the frames are stacked.

40. An assemblage as in claim 33 wherein the divider and the frame define two carrier slots each of a selected width.

41. An assemblage as in claim 42 wherein the carrier slot widths are different.

42. An assemblage as in claim 33 wherein the divider attachment elements include divider receiving slots.

43. An assemblage as in claim 34 wherein a stack of frames includes at least one upper frame stacked on and independently removable from one of a lower composite frame, and, a lower frame.

44. An assemblage as in claim 43 wherein component carriers in the lower one of a lower composite frame and a lower frame are retained in place by the upper frame.

45. A system for carrying a plurality of discrete components comprising:

an elongated tray having a pair of elongated sides of selected height joined by a pair of ends wherein each of the ends carries a plurality of discrete latching elements wherein the elements are spaced along the respective end;

a plurality of identical elongated support members, independent of the tray, wherein each member has at least one engagement feature for releasably locking the member to a selected latching element whereby the respective supporting member extends parallel to one of the sides defining an elongated region of a first width bounded by the one side and the one support member; and an elongated, flexible strip defining a plurality of component receiving pockets wherein the strip includes first and second axially extending support edges wherein the pockets have a pocket width, less than the first width, whereby the strip can be supported in the region between the one side and the one support member with portions of the support edges resting on portions of the one side and portions of the one support member.

46. A system as in claim 45 wherein the tray carries a latch, engageable with a latch on a second tray in response to reversing the orientations of the latches, relative to one another.

47. A system as in claim 45 wherein a second elongated region, of a second width, is defined between the one support member and the other side of the tray and a second elongated, flexible strip defining a plurality of component receiving pockets bounded by third and fourth axially extending support edges wherein the pockets have a second pocket width, less than the second width wherein the second strip can be supported in the second region between the other side of the tray and the support member with portions of the third and fourth support edges resting on portions of the other side and portions of the one support member.

48. A system as in claim 45 wherein at least the one support member carries spaced apart, strip retaining devices.

49. A system as in claim 45 wherein at least the one support member carries at least one strip retaining device.

50. A system as in claim 45 wherein at least the one support member carries a plurality of elongated strip retaining devices.

51. A tray system as in claim 1, comprising:

a plurality of component carriers, wherein each carrier releasably engages at least one pair of engagement portions, the component carriers extending parallel to the side walls and wherein two carriers define regions of first and second widths bounded in part by a respective side wall with a third region having a respective third width and bounded in part by the two carriers, said carriers including upstanding formations on a top surface thereof to retain said carrier tape on said top surface.

52. A system as in claim 51 including a second tray, substantially identical to the tray, wherein the trays are stackable.

53. A system as in claim 52 wherein the trays include tray-latching members whereby the stacked trays can be latched together.

54. A system as in claim 53 wherein the trays are rotated 180° relative to one another to produce a latched stack.

55. A tray system as in claim 1 wherein the carrier is, at least in part, movable in a direction parallel to said side walls while releasably engaging both of the front and rear walls.

56. A system as in claim 2 wherein the rails extend parallel to the side walls and are movable, in parallel therewith while simultaneously releasably engaging the front and rear walls.

57. A tray as in claim 13 wherein the rails are movable in parallel with one another and in parallel with the another set of walls to an engagement position.

58. A tray system as in claim 1, wherein:

said component carrier comprises a rail and a strip of component holding carrier tape supported along one edge by said rail, said rail including said front and rear portions; and said frame being entirely open between one of said side walls and said rail, said strip of component holding carrier tape being hung on said one of said side walls and said rail, spanning unsupported transversely between said one of said side walls and said rail.

59. A tray system as in claim 21, wherein said retaining elements comprise pegs, and said partition comprises slots at opposite ends thereof to each snap engage one of said pegs.

60. A tray system as in claim 21, wherein said retaining elements comprise grooves and said partition comprises a tapered profile at each end, each of said tapered profiles resiliently gripped within one of said slots.

61. A tray system as in claim 21, wherein at least one of said carrier receiving surfaces includes an upstanding pin adapted to be received in a hole of the respective carrier.

62. A tray system as in claim 21, wherein at least one of said carrier receiving surfaces includes a hook element for overhanging an edge of said respective carrier for restraining vertical movement of said respective carrier.

63. A tray system as in claim 21, comprising means for vertically restraining said respective carrier on said carrier receiving surfaces.

64. A tray system as in claim 21, comprising means for horizontally restraining said respective carrier with respect to said carrier receiving surfaces.

\* \* \* \* \*